(12) United States Patent
Gill

(10) Patent No.: US 7,001,680 B2
(45) Date of Patent: Feb. 21, 2006

(54) LOW RESISTANCE MAGNETIC TUNNEL JUNCTION STRUCTURE

(76) Inventor: Hardayal Singh Gill, 545 Lytton Ave., Palo Alto, CA (US) 94301

( * ) Notice: Subject to any disclaimer, the term of this patent is extended or adjusted under 35 U.S.C. 154(b) by 0 days.

(21) Appl. No.: 10/629,884

(22) Filed: Jul. 29, 2003

(65) Prior Publication Data
US 2005/0025999 A1 Feb. 3, 2005

(51) Int. Cl.
*G11B 5/127* (2006.01)

(52) U.S. Cl. .............................. 428/811.1; 428/811.5; 428/812; 360/324.2

(58) Field of Classification Search ............... 428/694, 428/692; 360/324.11, 324.1, 324, 313; 365/171
See application file for complete search history.

(56) References Cited

U.S. PATENT DOCUMENTS

| 5,640,343 | A * | 6/1997 | Gallagher et al. ........... 365/171 |
|---|---|---|---|
| 5,712,612 | A * | 1/1998 | Lee et al. ................. 338/32 R |
| 6,097,579 | A * | 8/2000 | Gill ........................ 360/324.2 |
| 6,449,133 | B1 * | 9/2002 | Makino et al. ........ 360/324.11 |
| 2003/0017723 | A1 * | 1/2003 | Hiramoto et al. ........... 438/958 |
| 2004/0027733 | A1 * | 2/2004 | Matsukawa et al. ..... 360/324.2 |
| 2004/0041183 | A1 * | 3/2004 | Slaughter .................... 257/295 |
| 2004/0240123 | A1 * | 12/2004 | Amano et al. ........... 360/324.2 |

* cited by examiner

Primary Examiner—Kevin M. Bernatz (57) ABSTRACT

The present disclosure describes magnetic tunnel junction (MTJ) devices and systems involving the use of diffusion components selected to alter the device properties. The diffusion components migrate from one layer of the MTJ structure to the tunneling barrier layer. Incorporation of the migrated components at the barrier layer adjusts the properties of the MTJ device.

39 Claims, 9 Drawing Sheets

LOW RESISTANCE MAGNETIC TUNNEL JUNCTION STRUCTURE

BACKGROUND OF THE INVENTION

1. Field of the Invention

The present invention relates generally to magnetic storage systems and more particularly to low resistance magnetic tunnel junction devices.

2. Description of Related Art

Magnetic recording is a key segment of the information-processing industry. While the basic principles are one hundred years old for early tape devices, and over forty years old for magnetic hard disk drives, an influx of technical innovations continues to extend the storage capacity and performance of magnetic recording products. For hard disk drives, the areal density or density of written data bits on the magnetic medium has increased by a factor of more than two million since the first disk drive was used for data storage. Areal density continues to grow due to improvements in magnet recording heads, media, drive electronics, and mechanics.

A magnetoresistive (MR) sensor changes resistance in the presence of a magnetic field. Recorded data can be read from a recorded magnetic medium, such as a magnetic disk, because the magnetic field from the recorded magnetic medium causes a change in the direction of magnetization in the read element, which causes a corresponding change in the sensor resistance.

Recently, magnetic tunnel junction sensor devices have been proposed for a variety of applications, including read heads for magnetic disks as well as magnetoresistive random access memory. A magnetic tunnel junction (MTJ) is a type or magnetoresistive device made of at least two magnetic film layers separated by an insulating barrier. The insulating barrier is thin enough to allow electrons to quantum mechanically tunnel through the barrier. Resistance of an MTJ is directly related to the tunneling probability that depends on the relative orientation of the magnetization vectors of the magnetic layers. Because the orientation of the magnetization vector depends on the applied field, the resistance of a MTJ device varies in the presence of a magnetic field.

The MTJ device resistance limits the data access rate of a sensor incorporating an MTJ element. It is desirable to produce an MTJ sensor with low resistance to increase the data access rate for magnetic read heads and MRAM elements.

SUMMARY OF THE INVENTION

To overcome the limitations in the prior art described above, and to overcome other limitations that will become apparent upon reading and understanding the present specification, the present invention discloses methods, devices and systems relating to a magnetic tunnel junction device.

In accordance with one embodiment of the invention, a magnetic tunnel junction device includes a first magnetic layer and a second magnetic layer. At least one of the first and the second magnetic layers include diffusion components selected to adjust one or more properties of the tunnel junction device. A barrier layer is disposed between the first and the second magnetic layers. The barrier layer incorporates diffusion components migrated from the at least one magnetic layer. The migrated diffusion components adjust the one or more properties of the tunnel junction device.

In accordance with another embodiment of the invention a magnetic tunnel junction sensor includes a magnetic tunnel junction device including first and second magnetic layers and a barrier layer. At least one of the first and the second magnetic layers includes diffusion components selected to adjust one or more properties of the tunnel junction device. A barrier layer is disposed between the first and the second magnetic layers. The barrier layer incorporates diffusion components migrated from the at least one magnetic layer. The migrated diffusion components adjust the properties of the tunnel junction device. A magnetoresistance detector detects a resistance through the first and the second magnetic layers based on magnetic orientations of the first and the second magnetic layers.

In accordance with yet another embodiment of the invention, a magnetic storage system involves a movable magnetic recording medium and a magnetic tunnel junction sensor for detecting magnetic signals on the moveable recording medium. The magnetic tunnel junction sensor includes a first magnetic layer and a second magnetic layer, wherein at least one of the first and the second magnetic layers includes diffusion components selected to alter one or more properties of the tunnel junction sensor.

A barrier layer disposed between the first and the second magnetic layers includes diffusion components migrated from the at least one magnetic layer. The migrated diffusion components adjust the one or more properties of the tunnel junction sensor. The magnetic tunnel junction sensor includes a magnetoresistance detector for detecting an electrical resistance through the first and the second magnetic layers based on magnetic orientations of the first and the second magnetic layers. The magnetic storage system further includes an actuator, coupled to the magnetic tunnel junction sensor, for moving the sensor relative to the medium.

Yet another embodiment of the invention involves a memory device including an array of memory elements configured to store information for later access. Each memory element comprises a first magnetic layer and a second magnetic layer. At least one of the first and the second magnetic layers is configured to include diffusion components selected to adjust one or more properties of the memory element. A barrier layer is disposed between the first and the second magnetic layers. The barrier layer includes migrated diffusion components from the at least one magnetic layer, the migrated diffusion components adjust the one or more properties of the memory element.

In another embodiment of the invention, a magnetic tunnel junction device includes means for providing a first magnetic layer incorporating diffusion components selected to adjust one or more properties of the tunnel junction device and means for providing a second magnetic layer. The magnetic tunnel junction device further includes means for providing a tunnel barrier layer between the first and the second magnetic layers. The tunnel barrier layer includes migrated diffusion components from the first magnetic layer. The migrated diffusion components adjust the one or more properties of the tunnel junction device.

A further embodiment of the invention involves a magnetic tunnel junction sensor. The magnetic tunnel junction sensor comprises means for providing a first magnetic layer configured to include diffusion components selected to adjust one or more properties of the tunnel junction sensor. The magnetic tunnel junction sensor further includes means for providing a second magnetic layer. A means for providing a barrier layer is disposed between the first and the second magnetic layers. The barrier layer means includes migrated diffusion components from the first magnetic layer, wherein the migrated diffusion components alter the one or more properties of the magnetic tunnel junction sensor. The sensor further includes means for measuring an electrical resistance through the first and the second magnetic layers based on magnetic orientations of the first and the second magnetic layers.

In accordance with yet another embodiment of the invention, a magnetic storage system includes means for storing magnetic data and means for sensing magnetically stored data. The means for sensing includes means for providing a first magnetic layer configured to include diffusion components selected to alter one or more properties of the sensing means, means for providing a second magnetic layer, and means for providing a barrier layer between the first and the second magnetic layers, the barrier layer including diffusion components migrated from the first magnetic layer and altering the one or more properties.

The magnetic storage means further includes means for detecting an electrical resistance through the sensing means based on magnetic orientations of the first and the second magnetic layers and means for moving the means for sensing relative to the means for magnetic data storage.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings, which form a part hereof, and in which is shown by way of illustration the specific embodiment in which the invention may be practiced. It is to be understood that other embodiments may be utilized as structural changes may be made without departing from the scope of the present invention.

The present disclosure describes magnetic tunnel junction (MTJ) devices and methods based on migration of junction enhancing diffusion components from one layer of the MTJ structure to the tunneling barrier layer. According to various embodiments, an MTJ device is described including a barrier layer incorporating migrated components from a magnetic layer. Incorporation of the migrated components into the barrier layer has been found to decrease the resistance of the MTJ device. For example, the migrated components in the barrier layer decrease the bandgap of the barrier layer, thus making it easier for carriers to tunnel from one magnetic layer to another. In addition, the migrated components reduce oxidation of the magnetic layer due to passivation provided by the migrated components at the magnetic layer/barrier layer interface.

The MTJ device having an enhanced barrier layer may be formed by depositing a first and a second magnetic layer, wherein at least one of the first and the second magnetic layer incorporates diffusion components. The barrier layer is formed between the first and the second magnetic layers. The structure is annealed, facilitating the migration of the diffusion components from the magnetic layer to the barrier layer.

Any or all of the magnetic layers and barrier layer may have a multi-layered structure. In addition, one or more of the magnetic layers may include one or more sub-layers that are non-magnetic. The magnetic layers, as referred to in this disclosure, generally refer to single or multi-layered structures coupled through a tunneling barrier layer. The diffusion components may homogeneous, comprising a single type of element, compound or other material, or may be heterogeneous, comprising multiple element, compound, or material types.

The MTJ device described in the present disclosure may be used in connection with various technologies. In one example, the MTJ device may be used as a component of a read head for reading data recorded on a magnetic disk. In another example, the MTJ device may be used as a memory element in a magnetic random access memory array.

Figure 1:
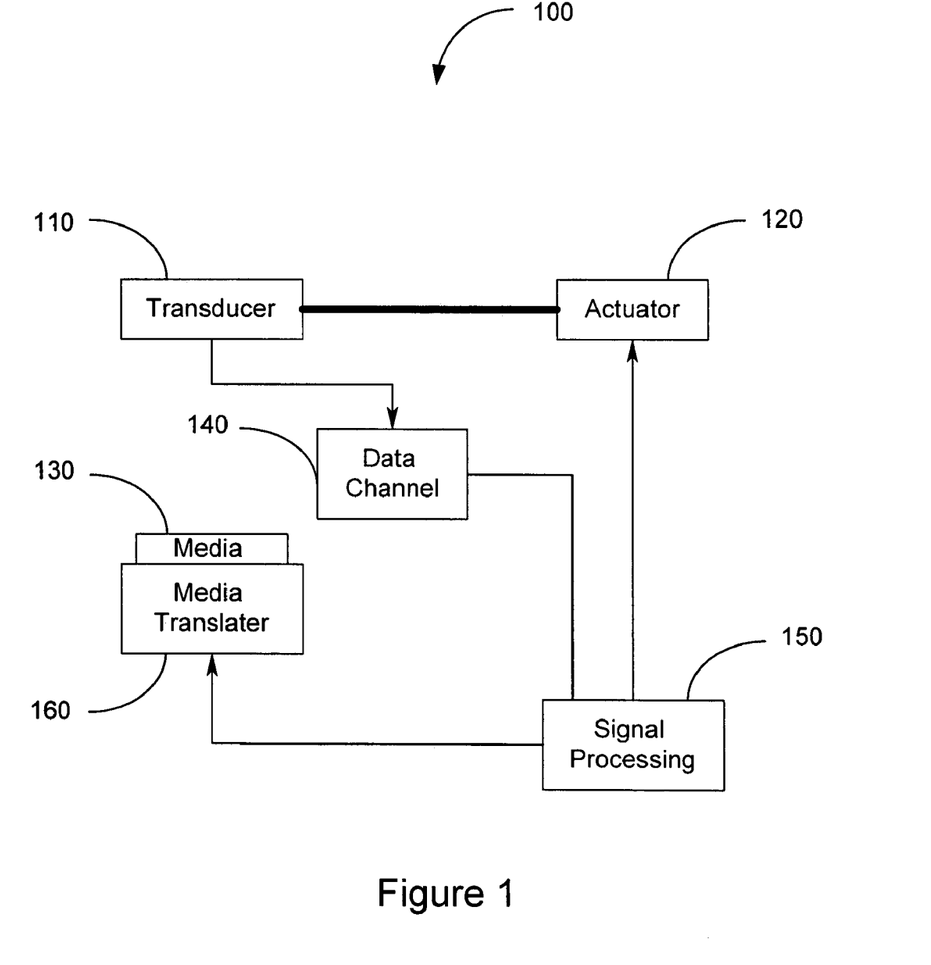
FIG. 1 is a block diagram of a storage system in accordance with embodiments of the present invention.

FIG. 1 is a block diagram illustrating a magnetic data storage system 100 that may incorporate an MTJ device in accordance with embodiments of the invention. The magnetic data storage system includes an actuator 120 that controls the position of a transducer 110. The transducer 110 writes and reads data on the magnetic media 130. The read/write signals are passed to a data channel 140. A signal processor 150 controls the actuator 120 and processes the signals of the data channel 140. In addition, a media translator 160 is controlled by the signal processor 150 to cause the magnetic media 130 to move relative to the transducer 110. The present invention is not meant to be limited to a particular type of storage system 100 or to the type of media 130 used in the storage system 100.

Figure 2:
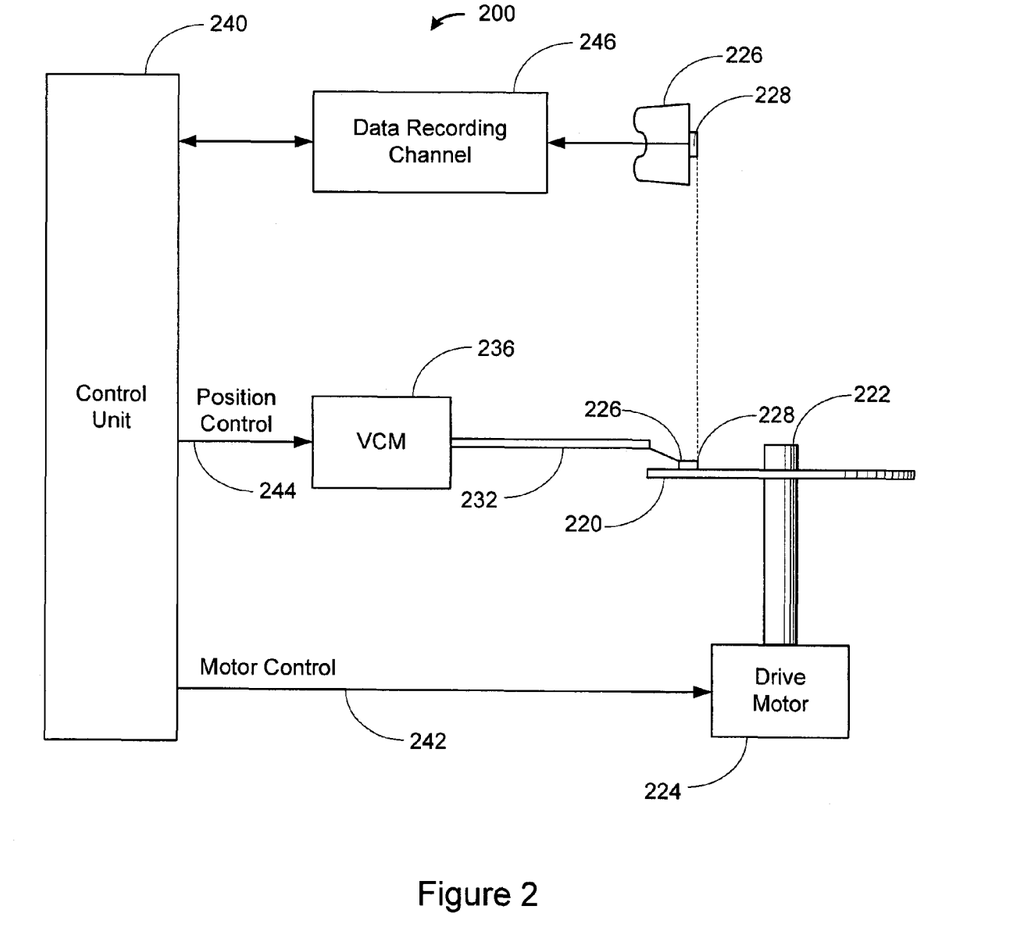
FIG. 2 is a diagram of a magnetic disk storage system incorporating a MTJ sensor in accordance with embodiments of the present invention.

FIG. 2 is a block diagram representing one example of a storage system 200, e.g., a hard disk drive storage system, according to the present invention. The system 200 includes a spindle 222 that supports and rotates at least on rotatable magnetic disk 220 when driven by motor 224. Magnetic data is stored on the magnetic disk 220 in the form of an annular pattern of concentric data tracks (not shown).

At least one slider 226 is positioned on the disk 220, each slider 226 supporting one or more magnetic read/write heads 228 where the heads 228 incorporate a MTJ device of the present invention. As the disk(s) 220 rotate, slider 226 is moved radially in and out over disk 220 so that heads 228 may access different portions of the disk 220 where desired data is recorded. Each slider 226 is attached to an actuator arm 232 by means of a suspension 234. The suspension 234 provides a slight spring force, which biases slider 226 against the disk 220. Each actuator arm 232 is attached to an actuator 236. The actuator 236 may be a voice coil motor (VCM). The VCM has a coil movable within a fixed magnetic field, the direction and speed of the coil movements being controlled by motor current signals supplied by a control unit 240.

During operation of the disk drive 200, the rotation of the disk 220 generates an air bearing between slider 226 and the disk 220, which exerts an upward force or lift on the slider 226. The surface of the slider 226, which includes head 228 and faces the surface of disk 220 is referred to as an air-bearing surface (ABS). The air bearing thus counterbalances the slight spring force of suspension 234 and, during normal operation, supports the slider 226 off of, and slightly above, the disk 220 at a small, substantially constant spacing.

The various components of the disk drive 200 are controlled in operation by control signals generated by a control unit 240, such as access control signals and internal clock signals. Typically, control unit 240 has logic control circuits, storage apparatus, and a microprocessor. The control unit 240 generates control signals to control various system operations such as drive motor control signals on line 242 and head position and seek control signals on line 244. The control signals on line 244 provide the desired current profiles to optimally move and position the slider 226 to the desired data track on the disk 220. Read and write signals are communicated to and from read/write heads 228 through recording channel 246.

Figure 3:
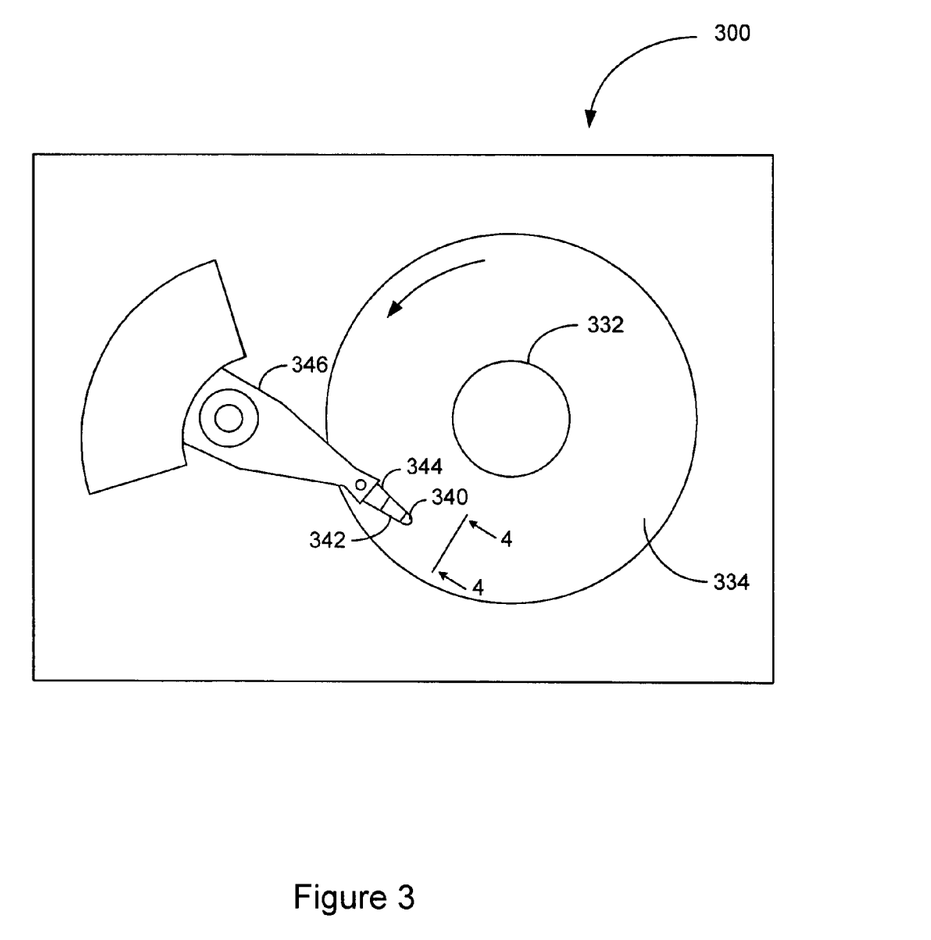
FIG. 3 illustrates a top view of components of a magnetic disk storage system in accordance with embodiments of the invention.

The above description of a typical magnetic disk drive storage system 200, and the accompanying illustration of FIG. 3 are for representation purposes only. It should be apparent that disk storage systems may contain a large number of disks and actuators, and that each actuator may support a number of sliders. Many other variations of the basic typical magnetic disk drive storage system 200 may be used in conjunction with the present invention while keeping within the scope and intention of the invention. However, those skilled in the art will recognized that the present invention is not meant to be limited to magnetic disk drive storage systems as illustrated in FIG. 2.

Figure 4:
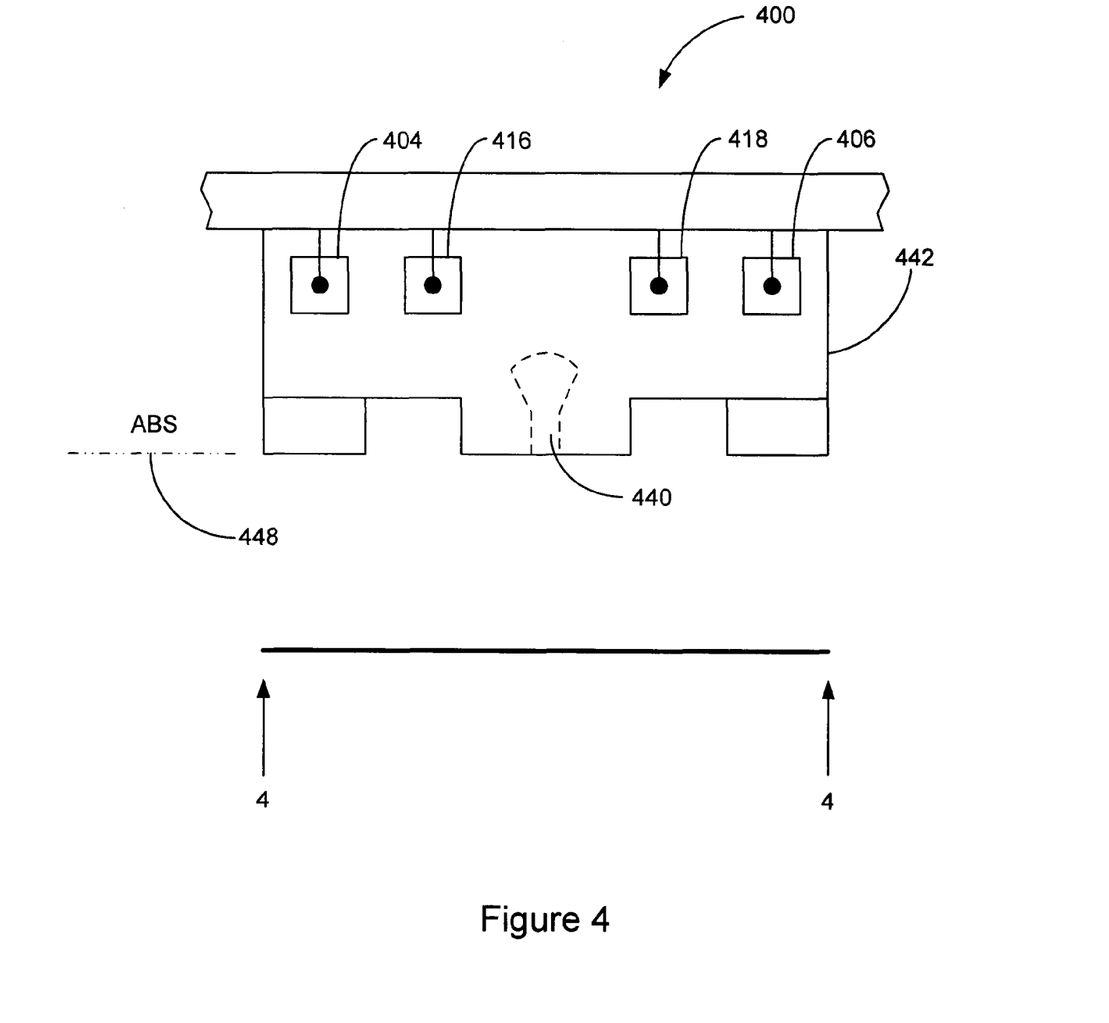
FIG. 4 illustrates an example of a magnetic disk read/write head incorporating a magnetic tunnel junction sensor in accordance with embodiments of the present invention

FIG. 3 is a top view 300 of a magnetic disk drive. The magnetic disk drive 300 includes a spindle 332 that supports and rotates a magnetic disk 334. A combined read and write magnetic head 340 is mounted on a slider 342 that is supported by a suspension 344 and actuator arm 346. The present invention is not limited to a single unit, and a plurality of disks, sliders and suspensions may be employed in a large capacity direct access storage device (DASD). The suspension 344 and actuator arm 346 position the slider 342 so that the magnetic head 340 is in a transducing relationship with a surface of the magnetic disk 334. When the disk 334 is rotated by a motor, the slider is supported on a thin cushion of air (air bearing) between the surface of the disk 334 and the air-bearing surface (ABS) (FIG. 4—448). The magnetic head 340 may then be employed for writing information to multiple circular tracks on the surface of the disk 334, as well as for reading information therefrom.

FIG. 4 illustrates one example of a magnetic disk read/write head incorporating a magnetic tunnel junction sensor 400 according to the present invention. As shown in FIG. 4, first and second solder connections 404 and 416 connect leads from the slider 442 to a suspension (FIG. 3—346). Third and fourth solder connections 418 and 406 connect leads from a coil 440 in the magnetic head to the suspension (FIG. 3—346). However, one of ordinary skill in the art will realize that the present invention is not meant to be limited the magnetic sensor configuration shown in Figure, but that other MTJ sensor configurations may be used in the present invention.

Figure 5:
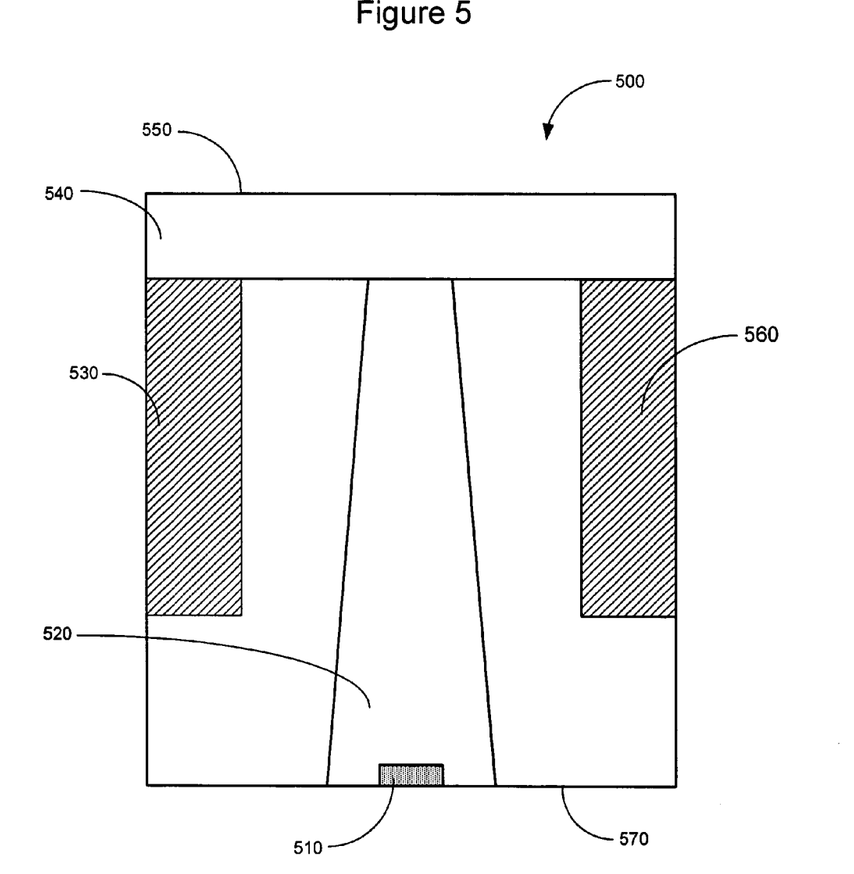
FIG. 5 illustrates an ABS view of a slider incorporating a MTJ sensor in accordance with embodiments of the invention.

FIG. 5 is a view of the slider 500 and magnetic head 510 from the air bearing surface. The slider has a center rail 520 that supports the magnetic head 510, and side rails 530 and 560. The support rails 520, 530 and 560 extend from a cross rail 540. With respect to rotation of a magnetic disk, the cross rail 440 is positioned at a leading edge 550 of slider 400 and the magnetic head 510 is positioned at a trailing edge 570 of slider 500.

The above description of magnetic storage systems, shown in the accompanying FIGS. 1–5, are for presentation purposes only and the present invention is not meant to be limited to the magnetic storage systems illustrated therein. For example, magnetic storage systems may contain a plurality of recording media, e.g., magnetic tape, and a plurality of actuators. Each actuator may support a number of sliders. In addition, instead of an air-bearing slider, the head carrier may be one that maintains the head in contact or near contact with the medium, such as in liquid bearing and other contact and near-contact recording devices.

Figure 6:
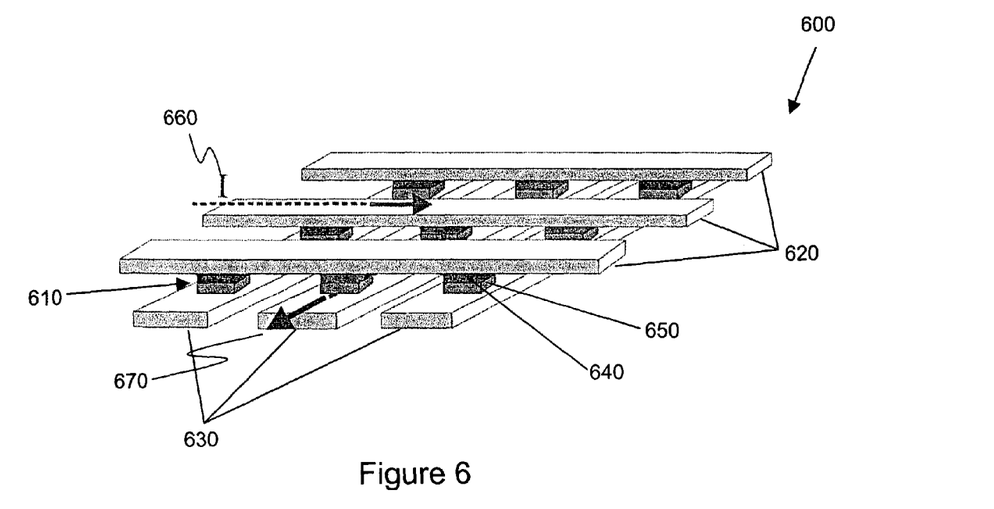
FIG. 6 illustrates a cross point architecture used in connection with a memory system in accordance with embodiments of the invention.

FIG. 6 illustrates one embodiment of a magnetic memory device 600, e.g., magnetic random access memory (MRAM). Memory elements of MRAM have at least two magnetically stable states that can be written to and read from electronically. A memory device 600, such as MRAM, may be implemented as a solid-state non-volatile magnetic storage device in which each bit of data is stored in a magnetoresistive element 610, such as a magnetic tunnel transistor incorporating a magnetic tunnel junction. Magnetic tunnel transistors are described in commonly owned U.S. patent application Ser. No. 10/428,474, filed on May 2, 2003, which is incorporated herein by reference in its entirety.

The non-volatility of MRAM devices provides an advantage over traditional semiconductor dynamic RAM, because MRAM does not require data to be periodically refreshed. Further, MRAM devices provide the advantages of low power consumption, high packaging density, and fast read and write access times.

Solid-state MRAM may use anisotropic magnetoresistance (AMR) films (i.e., a material that changes its resistance with an applied magnetic field) as the magnetoresistive element 610. The larger the magnetoresistive (MR) response (e.g., a response from a giant magnetoresistance (GMR) film), the more commercially viable the MRAM becomes. However, packaging of the MRAM using a GMR film is not as efficient as, for example, as the packaging of magnetic tunnel junctions (MTJs) of magnetic tunnel transistors (MTTs). The magnetic tunnel junctions of magnetic tunnel transistors provide high packing density by using an implementation denoted cross-point architecture, described in more detail below.

Cross point architecture presents one possible embodiment of an MRAM structure comprising an array of parallel sense lines 620 and parallel word lines 630. At each junction of the parallel sense lines 620 and parallel word lines 630 is a magnetoresistive element 610. The magnetoresistive element 610 may consist of two magnetic layers of different coercivity, one hard 640 and one soft 650. Magnetic fields generated by currents 660, 670 passing simultaneously through a sense line 620 and a word line 630 provides writing to an element 610 at the intersection of the two lines 620, 630. The detection of resistance changes in a sense line 620 caused by a smaller measured current 670 in the word line 630 provides a reading of the element 610.

More particularly, the direction of magnetization of the hard layer 640 is used to represent the data bit. To write data, a magnetic field is applied by passing a current 670 through a conductor line (word line 630) adjacent to the element 610 such that the field is large enough to change the magnetization of the hard layer 640. To read, a smaller current is passed, which can change the magnetization of the soft layer 650 only. The resistance of the element depends on whether the hard 640 and soft 650 layers are magnetized parallel or anti-parallel. Hence, changes in the resistance resulting from the reversal of the soft layer 650 can be used to probe the magnetic state of the hard layer 640.

Figure 7:
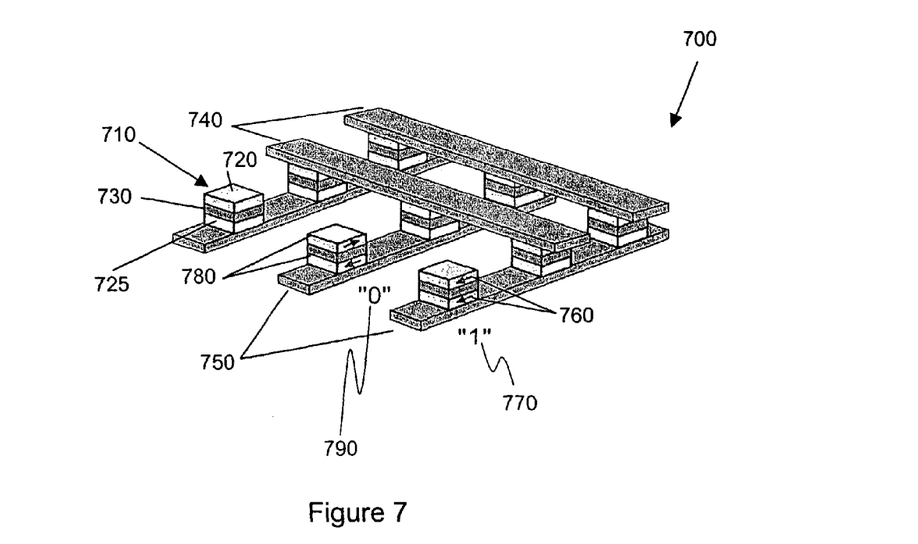
FIG. 7 illustrates the operation of a memory system incorporating MTJ memory elements in accordance with embodiments of the invention.

FIG. 7 illustrates the operation of a magnetic memory 700, e.g., MRAM, using MTJ devices as memory elements. The design in FIG. 7 uses a magnetic tunnel junction cell 710 consisting of two magnetic layers 720, 725 separated by a thin insulating barrier layer 730. The magnetic tunnel junction 710 is disposed at the intersection of sense lines 740 and word lines 750. A first layer 720 polarizes the spins of current-carrying electrons, which cross the barrier 730 to a second layer 725 by quantum tunneling when both layers are aligned 760 to produce, for example, a one bit ("1") 770. When the magnetism of the second ferromagnetic layer is reversed 780, the tunneling is reduced and a zero bit ("0") 790 is produced.

Figure 8:
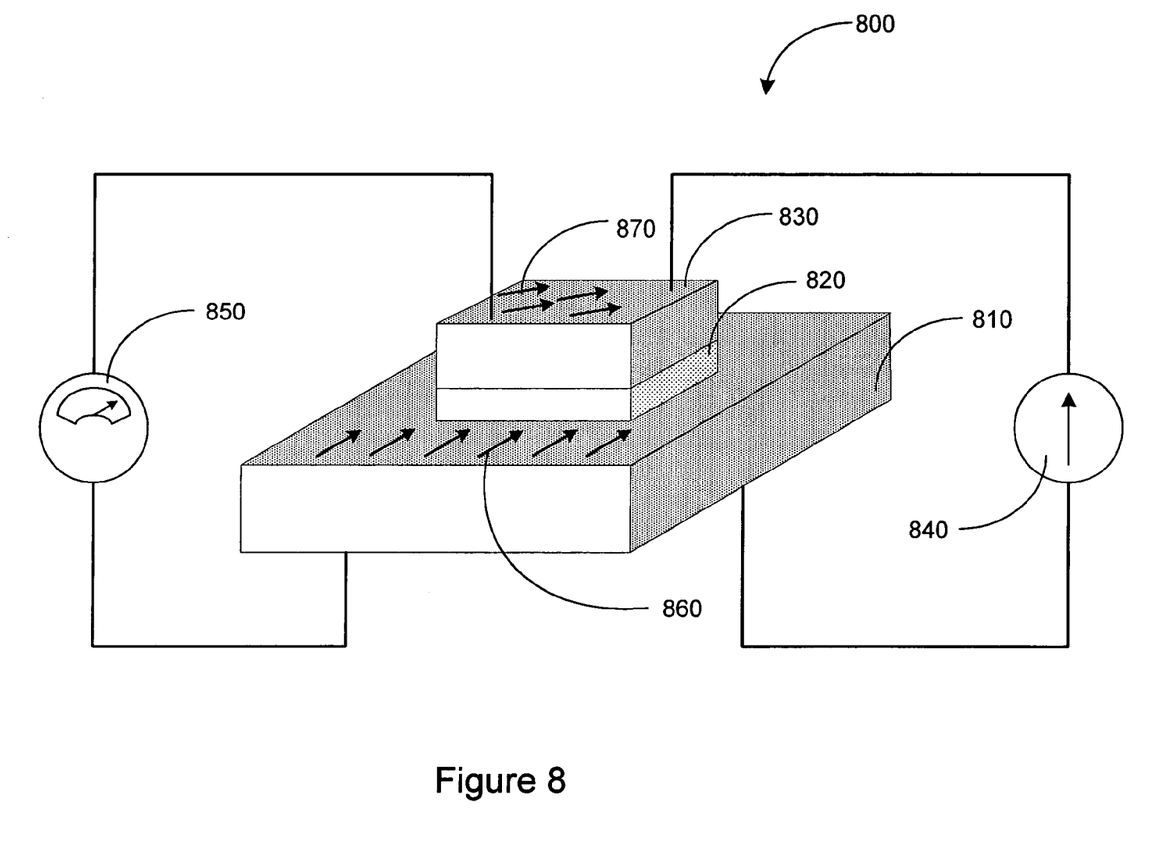
FIG. 8 illustrates the operation of a magnetic field sensor utilizing an MTJ device in accordance with embodiments of the invention.

FIG. 8 illustrates an example embodiment of a magnetic sensor 800, suitable for use in a magnetic disk read head, implemented using an MTJ device. In this example embodiment, a MTJ device comprises two ferromagnetic layers, 810, 830, and an insulating barrier layer 820 disposed between the ferromagnetic layers 810, 830. Current through an MTJ results from electron tunneling through the barrier layer 820 from one ferromagnetic layer 830 to the other ferromagnetic layer 810. Resistance of the MTJ sensor 800 is directly related to tunneling probability, which is dependent on the relative orientations of the magnetization vectors 860, 870 of the ferromagnetic layers 810, 830.

In one implementation, a first ferromagnetic layer 810, may be pinned, wherein the orientation of the magnetization vector 860 is fixed. A second ferromagnetic layer 830, may be a free magnetic layer, wherein the orientation of the magnetization vector 870 is free to change based on an applied magnetic field. When the MTJ sensor is moved into a magnetic field region, such as the magnetic field of a data bit recorded on a magnetic disk, the orientation of the magnetization vector 870 of the free layer aligns according to the applied field.

The dependence of tunneling on the relative orientation of the magnetization vectors 860, 870 arises from the asymmetry in the electron density of states of the majority/minority carrier energy bands in the ferromagnetic material. When the magnetization vectors 860, 870 are parallel, the number of occupied energy states in one magnetic layer and available energy states in the other magnetic layer is at a maximum. This situation creates an increased tunneling probability, and tunneling resistance is decreased. When the magnetization vectors 860, 870 are anti-parallel, there is a mismatch between the number of occupied states in one magnetic layer 830 and the available energy states in the other magnetic layer 810. Anti-parallel alignment of the magnetization vectors 860, 870 causes tunneling to decrease, which leads to an increase in the resistance of the MTJ. The change in the resistance of the MTJ may be detected by driving the junction with a small sense current 840 and detecting the change in the magnetoresistance 850 of the MTJ as the MTJ is moved through the magnetic field.

The resistance of the MTJ devices must be low, e.g., less than 1 $\Sigma$ micrometer square and maintain an acceptable magnetoresistive response. The use of low bandgap materials to form the barrier layer of 830 of MTJ devices decreases the resistance of the MTJ device. Typically, the barrier layer 830 may be formed using naturally oxidized $AlO_x$ Barrier layers comprised of lower bandgap materials, e.g., $ZrAlO_x$, $HfAlO_x$, provide decreased resistance while maintaining reasonable MR response.

In accordance with various embodiments of the invention, low bandgap, low resistance MTJ devices may be formed through controlled migration of diffusion components from a magnetic layer towards or into the barrier layer. The diffusion components, e.g., Hf, Zr, migrate toward or into the barrier layer, e.g., comprised of $AlO_x$, due to the affinity of the diffusion components to oxygen. Incorporation of certain diffusion components from the magnetic layer into the barrier layer has been found to decrease the resistance of the MTJ device and/or lower the bandgap of the barrier layer. The migrated components may also passivate the material at the pinned magnetic layer/barrier layer interface, thus reducing oxidation of the pinned magnetic layer and increasing the MR response of the MTJ device.

An MTJ device having an enhanced barrier layer may be formed by depositing a first and a second magnetic layer, wherein at least one of the first and the second magnetic layer incorporates a diffusion component. The diffusion component is an element, compound, or other complex that migrates from a layer, e.g., the magnetic layer, of the MTJ to the barrier layer. The diffusion component may be used to decrease the resistance, lower the bandgap, passivate the layers of the magnetic tunnel junction, and/or otherwise enhance the properties of the MTJ device. The barrier layer is formed between the first and the second magnetic layers. Diffusion of the diffusion component may be facilitated through annealing or other thermal processing of the MTJ structure during manufacture.

Figure 9A:
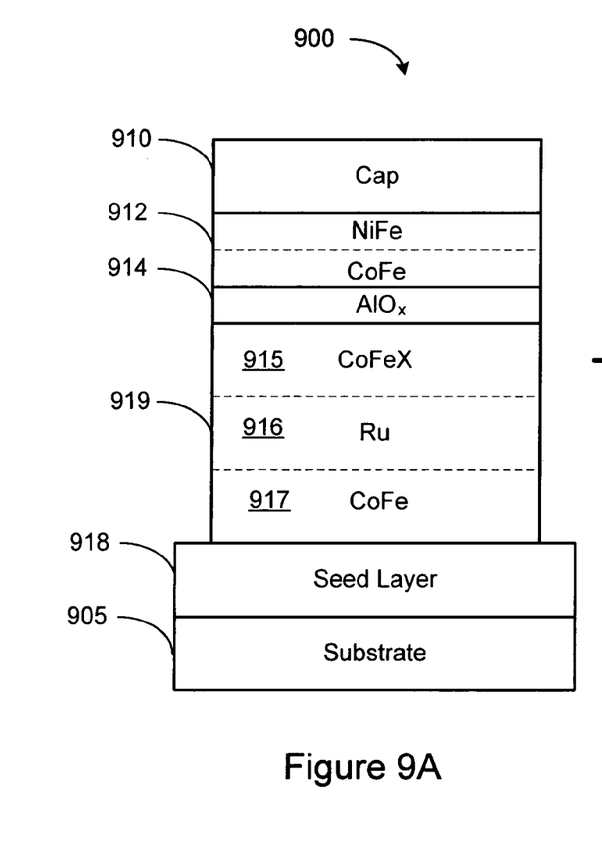
FIGS. 9A and 9B illustrate the layered structure of an MTJ device before and after thermal processing, respectively, in accordance with embodiments of the invention.

FIG. 9A illustrates one example of the layered structure of an MTJ device prior to thermal processing in accordance with embodiments of the invention. A first magnetic layer 916 of the MTJ device 900 may comprise a multi-layered structure that may be anti-ferromagnetically (AFM) pinned or self-pinned. An anti-ferromagnetically pinned magnetic tunnel junction comprises a structure having at least one ferromagnetic (FM) layer that is pinned by a nearby anti-ferromagnetic (AFM) layer. An anti-ferromagnetically pinned structure comprises at least one ferromagnetic (FM) layer adjacent to a thin non-ferromagnetic layer. The ferromagnetic layer is called the pinned layer because it is magnetically pinned or oriented in a fixed and unchanging direction by a thick adjacent AFM layer, commonly referred to as the pinning layer. The pinning layer pins the magnetic orientation of the pinned layer through anti-ferromagnetic exchange coupling.

In a self-pinned device, the magnetic moment of the pinned layer may be pinned in the fabrication process; i.e., the magnetic moment is set by the specific thickness and composition of the film. The self-pinned layer may be formed of a single layer of a single material or may be a composite layer structure of multiple materials. It is noteworthy that a self-pinned MTJ requires no additional external layers applied adjacent thereto to maintain a desired magnetic orientation.

The active layers of the MTJ device may be fabricated on a substrate 905 comprised of any suitable composition including semiconductor material, glass, or a ceramic material such as alumina ($Al_2O_3$). The MTJ device 900 may be fabricated in any acceptable system to sequentially deposit the multilayer structure on a substrate 905 as shown in FIG. 9A.

A seed layer 918 may be deposited on the substrate 905 to modify the crystallographic texture or grain size of the subsequent layers. The seed layer 918 may be multiple layers or a single layer, e.g., a single PtMn layer adjacent to substrate 905.

In one embodiment of the present invention, a first magnetic layer 919 may comprise a self-pinned structure. The first magnetic layer may include, for example, at least two ferromagnetic films 915, 917 separated by a thin anti-ferromagnetic coupling film 916. In this structure, a thick adjacent anti-ferromagnetic layer used for pinning the pinned layer can be eliminated. The two ferromagnetic films 915, 917 comprising the laminated pinned layer are anti-ferromagnetically coupled to one another by means of the appropriate type and thickness of the anti-ferromagnetic coupling film 916 so that the magnetizations of the two ferromagnetic films 915, 917 are oriented anti-parallel to one another.

For example, the self-pinned multi layer structure 919 may include a composite laminate structure having a first layer 917 comprised of CoFe, an inner layer 916 comprised of Ru, and a second layer 915 comprised of an alloy of CoFe and incorporating diffusion components of a suitable diffusion element X, e.g., CoFeHf or CoFeZr. The composite laminate structure achieves high pinning strength due to the use of the positive magnetostriction of the CoFe material. However, the invention is not limited to these materials and other materials are possible for use in place of the CoFe and Ru materials to form the first magnetic layer 919.

High pinning strength is required to maintain a first magnetic vector orientation (FIG. 8, 860) allowing the self-pinned layer to be substantially constant while being exposed to non-magnetizing effects. Such increased pinning strengths are effective to, among other features, increase the dynamic range of the magnetoresistive tunneling effect, i.e., the magnitude of the change in resistivity of MTJ device 900. Also, the self-pinning field of pinned layer 919 should be greater than any demagnetizing fields at an operating temperature of the MTJ device 900 to insure that the magnetization direction (FIG. 8, 860) of self-pinned structure 916 remains substantially fixed during the application of the external signal fields.

The first magnetic layer 919 comprises the alloy of CoFe and incorporates diffusion components selected to adjust one or more properties of the device, e.g., series resistance and/or barrier layer bandgap. The alloy of CoFe is denoted herein as CoFeX, where X is any appropriate element, compound or other material, including, e.g., Hf or Zr. CoFeX may be deposited by any suitable method as an amorphous alloy providing a very smooth layer for the growth of the very thin barrier layer to avoid pinholes and other defects that may increase the resistance of the barrier layer 914.

Figure 9B:
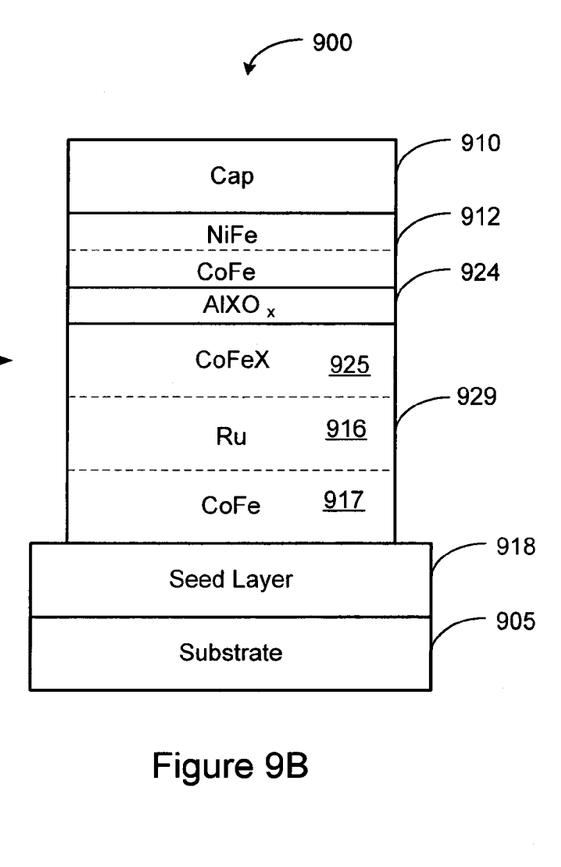

A barrier layer 914 may be formed adjacent to the first magnetic layer 919. The barrier layer 915 may be comprised, for example, of $AlO_x$ having a thickness in a range of about 3 to about 6 Å. A second magnetic layer 912 may be formed adjacent to the barrier layer 914. The second magnetic layer formed of a ferromagnetic material, such as CoFe, or NiFe. The second magnetic layer may be a layered structure, as illustrated in FIGS. 9A and 9B, of ferromagnetic materials. A cap layer 910 may be formed adjacent the second magnetic layer 912.

FIG. 9B shows the structure of the MTJ device following thermal processing, e.g., annealing at a temperature less than about 300 C (degree centigrade). As illustrated in FIG. 9B, a portion of the diffusion components, e.g., Hf and/or Zr, migrate from the CoFeX alloy layer 925 of the first magnetic layer 929 to the barrier layer 924. The diffusion elements may be incorporated into the barrier layer 924 forming a barrier layer comprising $XAlO_x$. As previously discussed, incorporation of the migrated diffusion components into the barrier layer adjusts the properties of the MTJ device. For example, incorporation of the diffusion components into the barrier layer 924 may lower the bandgap of the barrier layer 924 and/or decrease the resistance of the MTJ device 900. Further, the diffusion components may act to passivate the pinned layer 925/barrier layer 924 interface, thus preventing oxidation of the pinned layer 925 and increasing the dR/R response.

Figure 10:
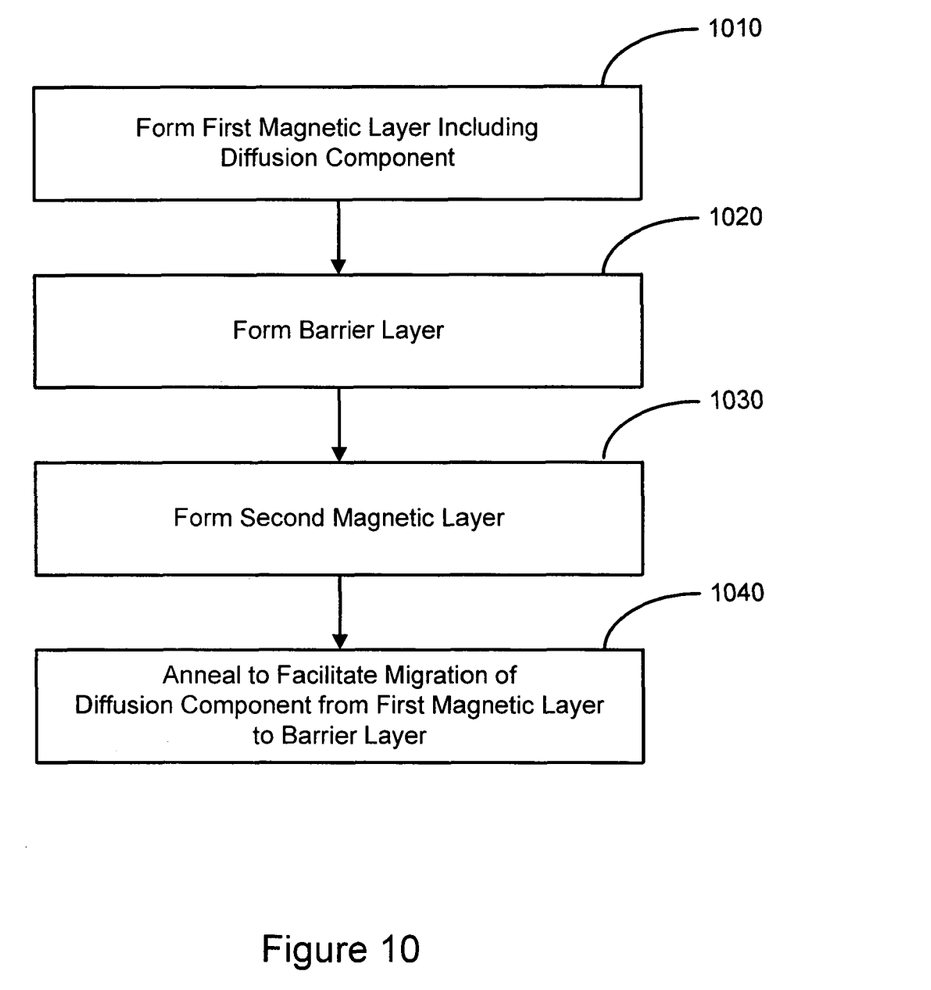
FIG. 10 is a flow graph of a method for forming a magnetic tunnel junction device in accordance with embodiments of the inventions.

FIG. 10 is a flow graph illustrating a method of manufacturing a MTJ device according to example embodiments of the invention. A first magnetic layer is formed 1010 incorporating a diffusion component. A barrier layer is formed 1020 adjacent the first magnetic layer. A second magnetic layer 1030 is formed adjacent the barrier layer. The MTJ structure is annealed to facilitate migration of the diffusion components from the first magnetic layer into the barrier layer 1040.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A magnetic tunnel junction device, comprising:
   a first magnetic layer and a second magnetic layer, at least one of the first and the second magnetic layers configured to include diffusion components selected to reduce a series resistance of a barrier layer, decrease a bandgap of a barrier layer, and/or passivate an interface of a barrier layer; and
   a barrier layer comprising oxygen and initially none of the diffusion components disposed between the first and the second magnetic layers; wherein after deposition of the barrier layer, a portion of the diffusion components are migrated from the at least one of the first and the second magnetic layers to the barrier layer.

2. The device of claim 1, wherein the diffusion components are selected to reduce a series resistance of the barrier layer.

3. The device of claim 1, wherein the diffusion components are selected to decrease a bandgap of the barrier layer.

4. The device of claim 1, wherein the diffusion components are selected to passivate an interface of the barrier layer.

5. The device of claim 1, wherein:
the first magnetic layer is a pinned magnetic layer; and
the second magnetic layer is a free magnetic layer.

6. The device of claim 1, wherein at least one of the first and the second magnetic layers is a multi-layer structure.

7. The device of claim 1, wherein at least one of the first and the second magnetic layers comprises an alloy of CoFe.

8. The device of claim 7, wherein the alloy of CoFe comprises CoFeHf.

9. The device of claim 8, wherein the CoFeHf comprises about 5 to about 10 atomic percent Hf.

10. The device of claim 7, wherein the alloy including CoFe comprises CoFeZr.

11. The device of claim 10, wherein the CoFeZr comprises about 5 to about 10 atomic percent Zr.

12. The device of claim 1, wherein the diffusion components comprise Hf.

13. The device of claim 1, wherein the diffusion components comprise Zr.

14. The device of claim 1, wherein the barrier layer including the migrated diffusion components comprises $AlHfO_x$.

15. The device of claim 1, wherein the barrier layer including the migrated diffusion components comprises $AlZrO_x$.

16. A magnetic tunnel junction sensor, comprising:
a magnetic tunnel junction device comprising:
a first magnetic layer and a second magnetic layer, at least one of the first and the second magnetic layers configured to include diffusion components selected to reduce a series resistance of a barrier layer, decrease a bandgap of a barrier layer, and/or passivate an interface of a barrier layer; and
a barrier layer comprising oxygen and initially none of the diffusion components between the first and the second magnetic layers, wherein after deposition of the barrier layer, a portion of the diffusion components are migrated from the at least one of the first and the second magnetic layers to the barrier layer;
a current source coupled to the first magnetic layer and the second magnetic layer; and
a magnetoresistance detector, coupled to the first and the second magnetic layers, for detecting an electrical resistance through the magnetic tunnel junction device based on magnetic orientations of the first and the second magnetic layers.

17. The device of claim 16, wherein the diffusion components are selected to reduce a series resistance of the barrier layer.

18. The device of claim 16, wherein the diffusion components are selected to decrease a bandgap of the barrier layer.

19. The device of claim 16, wherein the second magnetic layer is a free magnetic layer.

20. The device of claim 16, wherein the first magnetic layer is a pinned multi-layer magnetic structure.

21. The device of claim 16, wherein the first magnetic layer comprises an alloy of CoFe.

22. The device of claim 21, wherein the alloy of CoFe comprises CoFeHf.

23. The device of claim 21, wherein the alloy of CoFe comprises CoFeZr.

24. The device of claim 16, wherein the diffusion components comprise Hf.

25. The device of claim 16, wherein the diffusion components comprise Zr.

26. The device of claim 16, wherein the barrier layer including the migrated diffusion components comprises $AlHfO_x$.

27. The device of claim 16, wherein the barrier layer including the migrated diffusion components comprises $AlZrO_x$.

28. A magnetic storage system, comprising:
a movable magnetic recording medium;
a magnetic tunnel junction sensor for detecting magnetic signals on the moveable recording medium, comprising:
a first magnetic layer and a second magnetic layer, at least one of the first and the second magnetic layers configured to include diffusion components selected to reduce a series resistance of a barrier layer, decrease a bandgap of a barrier layer, and/or passivate an interface of a barrier layer;
a barrier layer comprising oxygen and initially none of the diffusion components between the first and the second magnetic layers, wherein after deposition of the barrier layer, a portion of the diffusion components are migrated from the at least one of the first and the second magnetic layers to the barrier layer; and
a magnetoresistance detector, coupled to the first and the second magnetic layers, for detecting an electrical resistance through the magnetic tunnel junction sensor based on magnetic orientations of the first and the second magnetic layers; and
an actuator, coupled to the magnetic tunnel junction sensor, for moving the sensor relative to the medium.

29. The device of claim 28, wherein the at least one of the first and the second magnetic layers comprises an alloy of CoFe.

30. The device of claim 29, wherein the alloy of CoFe comprises CoFeHf.

31. The device of claim 29, wherein the alloy of CoFe comprises CoFeZr.

32. The device of claim 28, wherein the diffusion components comprise Hf.

33. The device of claim 28, wherein the diffusion components comprise Zr.

34. The device of claim 28, wherein the barrier layer including the migrated diffusion components comprises $AlHfO_x$.

35. The device of claim 28, wherein the barrier layer including the migrated diffusion components comprises $AlZrO_x$.

36. A memory device, comprising:
an array of memory elements configured to store information for later access, each memory element comprising:
a first magnetic layer and a second magnetic layer, at least one of the first and the second magnetic layers configured to include diffusion components selected to reduce a series resistance of a barrier layer, decrease a bandgap of a barrier layer, and/or passivate an interface of a barrier layer; and
a barrier layer comprising oxygen and initially none of the diffusion components between the first and the second magnetic layers, wherein after deposition of the barrier layer, a portion of the diffusion components are migrated from the at least one of the first and the second magnetic layers to the barrier layer.

37. A tunnel junction device, comprising:
   means for providing a first magnetic layer incorporating diffusion components selected to reduce a series resistance of a barrier layer, decrease a bandgap of a barrier layer, and/or passivate an interface of a barrier layer;
   means for providing a second magnetic layer;
   means for providing a tunnel barrier layer comprising oxygen and initially none of the diffusion components between the first and the second magnetic layers, wherein after deposition of the barrier layer, a portion of the diffusion components are migrated from the at least one of the first and the second magnetic layers to the barrier layer.

38. A magnetic tunnel junction sensor, comprising:
   means for providing a first magnetic layer configured to include diffusion components selected to reduce a series resistance of a barrier layer, decrease a bandgap of a barrier layer, and/or passivate an interface of a barrier layer; and
   means for providing a second magnetic layer;
   means for providing a barrier layer comprising oxygen and initially none of the diffusion components between the first and the second magnetic layers, wherein after deposition of the barrier layer, a portion of the diffusion components are migrated from the at least one of the first and the second magnetic layers to the barrier layer; and
   means for measuring an electrical resistance through the first and the second magnetic layers and the barrier layer based on magnetic orientations of the first and the second magnetic layers.

39. A magnetic storage system, comprising:
   means for storing magnetic data;
   means for sensing the magnetically stored data, comprising:
      means for providing a first magnetic layer configured to include diffusion components selected to reduce a series resistance of a barrier layer, decrease a bandgap of a barrier layer, and/or passivate an interface of a barrier layer;
      means for providing a second magnetic layer; and
      means for providing a barrier layer comprising oxygen and initially none of the diffusion components between the first and the second magnetic layers, wherein after deposition of the barrier layer, a portion of the diffusion components are migrated from the at least one of the first and the second magnetic layers to the barrier layer; and
      means for detecting an electrical resistance through the means for sensing based on magnetic orientations of the first and the second magnetic layers; and
   means for moving the means for sensing relative to the means for magnetic data storage.

* * * * *

UNITED STATES PATENT AND TRADEMARK OFFICE
CERTIFICATE OF CORRECTION

PATENT NO. : 7,001,680 B2
APPLICATION NO. : 10/629884
DATED : February 21, 2006
INVENTOR(S) : Hardayal Singh Gill Page 1 of 1

It is certified that error appears in the above-identified patent and that said Letters Patent is hereby corrected as shown below:

On title page
Please add Assignee Name to Patent Cover: --Hitachi Global Storage Technologies Netherlands B.V.--

Item [73]
Please add Assignee Address to Patent Cover: --Amsterdam, The Netherlands--

Signed and Sealed this

Eleventh Day of September, 2007

JON W. DUDAS
*Director of the United States Patent and Trademark Office*